United States Patent
Miyanaga et al.

(10) Patent No.: US 8,377,204 B2
(45) Date of Patent: Feb. 19, 2013

(54) GROUP III NITRIDE SINGLE CRYSTAL AND METHOD OF ITS GROWTH

(75) Inventors: Michimasa Miyanaga, Itami (JP); Naho Mizuhara, Itami (JP); Shinsuke Fujiwara, Itami (JP); Seiji Nakahata, Itami (JP); Hideaki Nakahata, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 766 days.

(21) Appl. No.: 12/305,001

(22) PCT Filed: Jun. 16, 2006

(86) PCT No.: PCT/JP2006/312122
§ 371 (c)(1),
(2), (4) Date: Dec. 16, 2008

(87) PCT Pub. No.: WO2007/144955
PCT Pub. Date: Dec. 21, 2007

(65) Prior Publication Data
US 2009/0208749 A1    Aug. 20, 2009

(51) Int. Cl.
*C30B 23/00* (2006.01)
*B32B 5/16* (2006.01)
(52) U.S. Cl. .......................................... 117/84; 428/402
(58) Field of Classification Search .................. None
See application file for complete search history.

(56) References Cited

U.S. PATENT DOCUMENTS

| 5,858,086 | A | 1/1999 | Hunter |
| 6,001,748 | A | 12/1999 | Tanaka et al. |
| 6,296,956 | B1 | 10/2001 | Hunter |
| 7,632,454 | B2 * | 12/2009 | Schlesser et al. ............... 419/39 |
| 2002/0170490 | A1 | 11/2002 | Vodakov et al. |

FOREIGN PATENT DOCUMENTS

| CN | 1717508 A | | 1/2006 |
| JP | H10-053495 A | | 2/1998 |
| JP | 11116398 | * | 4/1999 |
| JP | 11116399 | * | 4/1999 |

(Continued)

OTHER PUBLICATIONS

Jeong-Gil Choi, "The Influence of Surface Properties on Catalytic Activities of Tantalum Carbides," Applied Catalysis A: General, Aug. 1999, pp. 189-201, vol. 184, No. 2, Elsevier, NY.

(Continued)

*Primary Examiner* — Melvin C Mayes
*Assistant Examiner* — Bijay Saha
(74) *Attorney, Agent, or Firm* — James W. Judge

(57) ABSTRACT

Affords methods of growing III nitride single crystals of favorable crystallinity with excellent reproducibility, and the III nitride crystals obtained by the growth methods. One method grows a III nitride single crystal (3) inside a crystal-growth vessel (11), the method being characterized in that a porous body formed from a metal carbide, whose porosity is between 0.1% and 70% is employed in at least a portion of the crystal-growth vessel (11). Employing the crystal-growth vessel (11) makes it possible to discharge from 1% to 50% of a source gas (4) inside the crystal-growth vessel (11) via the pores in the porous body to the outside of the crystal-growth vessel (11).

1 Claim, 1 Drawing Sheet

FOREIGN PATENT DOCUMENTS

| | | |
|---|---|---|
| JP | H11-116398 A | 4/1999 |
| JP | H11-116399 A | 4/1999 |
| JP | 2003-212696 A | 7/2003 |
| JP | 2005-225710 A | 8/2005 |
| JP | 2005-336010 A | 12/2005 |
| WO | WO-2005-012602 A1 | 2/2005 |
| WO | WO 2005012602 * | 2/2005 |

OTHER PUBLICATIONS

E. N. Mokhov et al., "Sublimation Growth of AlN Bulk Crystals in Ta Crucibles," Journal of Crystal Growth, Jul. 2005, pp. 93-100, vol. 281, No. 1, Elsevier, NY.

* cited by examiner

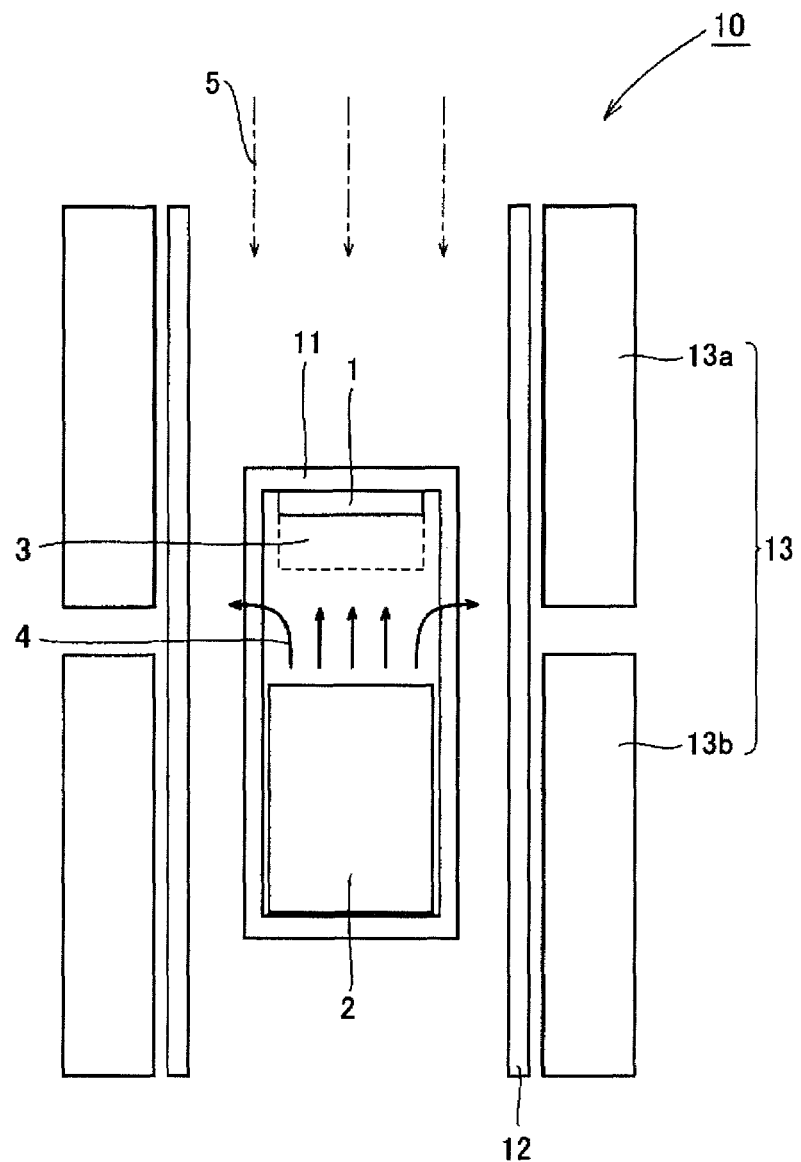

GROUP III NITRIDE SINGLE CRYSTAL AND METHOD OF ITS GROWTH

TECHNICAL FIELD

The present invention relates to bulk III nitride crystals of favorable crystallinity, and to methods of growing the crystals inside crystal-growth vessels.

BACKGROUND ART

Typically, growth of Group-III nitride crystal is carried out by vapor-phase methods such as sublimation, or by liquid-phase methods such as flux growth. Growing by sublimation AlN single crystal, one example of a III nitride crystal, requires a crystal-growth temperature of over 1900° C., as described, for example, in U.S. Pat. Nos. 5,858,086, 6,001,748, and 6,296,956. Owing to the high temperatures sublimation requires, for the crystal-growth vessels employed, carbon components of materials such as graphite and pyrolytic graphite, and high-melting-temperature metals such as tungsten (W) and tantalum (Ta) are routine.

A problem associated with using carbon components for the crystal-growth vessels, however, is that carbon (C) atoms in the carbon components mix as impurities into the AlN single crystal, degrading its crystallinity. Meanwhile, problems with utilizing high-melting-temperature metals for the crystal-growth vessels are that, owing principally to nitridation and carbonization of the metals, high-melting-temperature metals as crystal-growth vessel components wear away, and that, due to quantitative changes in materials for the crystal-growth vessels, reproducibility in the growth of single-crystals is compromised.

Moreover, with vapor-phase methods including sublimation, the atomic ratio of the Group-III element (Al) to nitrogen (N) in the precursors (the source gases for growing III nitride single crystal, ditto hereinafter) inside the crystal-growth vessel, as well as the concentration of impurity gases therein, has to be controlled so as to be constant. Consequently, it has been necessary to form a special exhaust structure in the crystal growth vessels for discharging a portion of the precursors and impurity gases inside the crystal-growth chamber to the crystal-growth vessel exterior.

Patent Reference 1: U.S. Pat. No. 5,858,086
Patent Reference 2: U.S. Pat. No. 6,001,748
Patent Reference 3: U.S. Pat. No. 6,296,956

DISCLOSURE OF INVENTION

Problems Invention is to Solve

An object of the present invention is to make available a method of growing, in bulk and with excellent reproducibility, Group III nitride single crystals of favorable crystallinity, and to make available III nitride crystals obtained by the growth method.

Means for Resolving the Problems

The present invention is a method of growing Group III nitride single crystal inside a crystal-growth vessel, the III nitride single crystal growth method being characterized in that a porous body, formed from a metal carbide, whose porosity is between 0.1% and 70% is utilized in at least a portion of the crystal-growth vessel.

In a Group III nitride single-crystal growth method involving the present invention, it is possible to have the elemental (atomic) ratio of metal to carbon in the metal carbide—metal: carbon—be from 9:1 to 4:6. It is also possible to have the metal carbide be TaC or a composite carbide containing TaC. It is further possible to have the amount of impurities included in the metal carbide be 500 ppm or less. Furthermore, from 1% to 50% of the source gases inside the crystal-growth vessel can be discharged via the pores in the porous body to the crystal-growth vessel exterior. Still further, it is possible to have the crystal-growth vessel be one in which at least a portion of the surface of a porous body, formed from a metal carbide, whose porosity is between 0.1% and 70%, is covered with a coating layer, formed from a metal carbide, whose porosity is less than 0.1%.

The present invention is also a Group III nitride single crystal obtained by the above-described III nitride single crystal growth method, the diameter of the III nitride single crystal being 2.5 cm or more, and its thickness being 200 μm or more.

EFFECTS OF THE INVENTION

The present invention affords methods of growing, in bulk and with excellent reproducibility, Group III nitride single crystals of favorable crystallinity, and affords III nitride crystals obtained by the growth methods.

BRIEF DESCRIPTION OF DRAWINGS

The Figure is a sectional schematic diagram representing one example of a III nitride single crystal growth method involving the present invention.

LEGEND

1: seed crystal
2: precursor
3: III nitride single crystal
4: source gas
5: exhaust gas
10: crystal-growth system
11: crystal-growth vessel
12: reaction chamber
13: heaters
13a: first heater
13b: second heater

BEST MODE FOR CARRYING OUT THE INVENTION

Referring to the Figure, one aspect of the present invention is a method of growing a III nitride single crystal 3 inside a crystal-growth vessel 11, the method being characterized in that a porous body, formed from a metal carbide, whose porosity is between 0.1% and 70% is employed in at least a portion of the crystal-growth vessel 11.

Herein, "III nitride single crystal" means compound single crystal formed from a Group-III element and nitrogen, and is represented by, for example, $Al_xGa_yIn_{1-x-y}N$ ($0 \leq y$, $x+y \leq 1$) single crystal. Examples of a major III nitride single crystal include AlN single crystal and GaN single crystal.

Furthermore, "porosity of the porous body" means percentage by volume of the pores with respect to the porous body, and is represented with the following formula (1).

$$\text{porosity (\%)} = 100 \times (\text{volume of pores})/(\text{volume of porous body}) \tag{1}$$

Metal carbide is superior in stability (reaction resistance and heat resistance) at high temperatures, compared with carbon components, and with high-melting-temperature metals. For this reason, utilizing a metal carbide as the material for at least a portion of the crystal-growth vessel 11 keeps crystal-growth vessel degradation to a minimum, and reduces the mixing of impurities into the III nitride single crystal from the crystal-growth vessel, making it possible to stably grow III nitride single crystals of favorable crystallinity, with excellent reproducibility.

Dense bodies formed from such metal carbides, however, are generally intractable, which is prohibitive of processing the dense body so as to have the form and size of crystal-growth vessels suited to growth of bulk single crystal. Furthermore, forming an exhaust structure for controlling source gases and impurity gases inside crystal-growth vessels so as to be constant is challenging, and thus stable growth of III nitride single crystal cannot be anticipated.

To counter this, utilizing as the material formed from a metal carbide a porous body having the plurality of pores heightens the tractability of the metal carbide material, enabling formation of crystal-growth vessels having the desired form and size. Therefore, as a principal constituent of crystal-growth vessel, metal carbide porous bulk material having a thickness of 200 μm or more may be utilized, for example. Furthermore, discharging the source gases and impurity gases inside crystal-growth vessels via the pores in the porous body to the crystal-growth vessel exterior makes it possible to control the source gases and impurity gases inside crystal-growth vessels so as to be constant without arranging a special exhaust structure in the crystal-growth vessels, leading to stable growth of III nitride single crystals of favorable crystallinity, with excellent reproducibility.

Herein, in the porous body formed from a metal carbide, the porosity is between 0.1% and 70%. With the porosity being less than 0.1%, tractability of the porous body and its ability to discharge source gases and impurity gases from its pores lowers. On the other hand, with the porosity being over 70%, an excessive increase in the amount of source-gas discharge from the pores in the porous body decreases crystal-growth rate of III nitride single crystal. Form these perspectives, the porosity in the porous body is preferably between 0.5% and 40%, and more preferably is between 5% and 30%.

Moreover, diameter of the pores in the porous body formed from a metal carbide is not particularly limited, but preferably is between 0.1 μm and 100 μm inclusive. With the pore diameter being less than 0.1 μm, the ability of the porous body to discharge source gases and impurity gases from its pores lowers. On the other hand, with the pore diameter being over 100 μm, an excessive increase in the amount of source gas discharge from the pores in the porous body decreases the crystal-growth rate of III nitride single crystal. From these perspectives, the diameter of a pore of the porous body is more preferably between 1 μm and 20 μm.

Referring to the Figure, in the present invention, it is preferable is that by adjusting the porosity in the porous body formed from a metal carbide, from 1% to 50% of source gases 4 inside the crystal-growth vessel 11 is discharged via the pores in the porous body to the outside of the crystal-growth vessel 11. Discharging impurity gases inside crystal-growth vessel, together with source gases therein, to the crystal-growth vessel exterior enables controlling the source gases and impurity gases inside the crystal-growth vessel so as to be constant. Herein, discharge of less than 1% of the source gasses lowers the ability to discharge the source gases and impurity gases. On the other hand, discharge of over 50% of the source gases leads to an excessive increase in the amount of crystal source gas discharge, decreasing crystal growth rate of III nitride single crystal.

Furthermore, in the present invention, in order to adjust amount of discharge of source gas and impurity gas inside the crystal-growth vessel 11 from the pores in the porous body, it is also preferable is that in the crystal-growth vessel, at least a part of the surface of the porous body formed from a metal carbide, with the porosity being 0.1% to 70%, is covered with a coating layer formed from a metal carbide, with porosity of the layer being less than 0.1%. Herein, the thickness of the coating layer is not particularly limited, but from the perspective of enhancing the effect in adjusting the amount of discharge of source gas and impurity gas, the thickness is preferably 30 μm or more.

It should be understood that in place of the above metal carbide coating layer, a W, Ta, or other high-melting-temperature metal coating layer may be formed. Herein, although the high-melting-temperature metal coating layer is subjected to nitridation or carbonization during growth of single crystals, there is no compromising of reproducibility in the growth of single crystals, because the volume of the coating layer is small.

Moreover, the metal carbide employed in the present invention is not particularly limited, so examples of the metal carbide include TiC, ZrC, NbC, MoC, TaC, WC, and composites containing two or more of the carbides. From the perspective of having high stability at high temperatures, the metal carbide is preferably a TaC or TaC-containing composite carbide.

Furthermore, the content of impurities in the metal carbide is preferably 500 ppm or less, which is from the perspective of reducing impurity gases inside crystal-growth vessel, and of keeping degradation of the crystal-growth vessel to a minimum.

Additionally, (the elemental (atomic) ratio of metal to carbon in the metal carbide—metal:carbon—is preferably 9:1 to 4:6. It should be understood that metal carbide is composed of: one or more metal carbide phases; one or more metal phases; and one or more metal carbide phases. Extent of deterioration of crystal-growth vessels formed employing metal carbide in which metal component ratio is greater than 9:1 increases, and crystal-growth vessels formed employing metal carbide in which metal component ratio is greater than 4:6 lowers in mechanical strength. Form these perspectives, metal:carbon is more preferably 8:2 to 5:5.

The method of forming the metal-carbide porous body or coating layer as described above is not particularly limited, so examples of the method include vapor-phase methods, press-baking or reaction baking of a metal carbide powder. Herein, reaction baking is a method of baking powder mixture of metal and carbon in the predetermined elemental (atomic) ratio to form metal carbide. Reaction baking has an advantage in highly purifying metal carbide because binders that are low-melting-temperature impurities are not employed, and from the perspective of producing materials having high mechanical strength and impact resistance, due to the fact that particles tightly combine with each other even in high percentages of pores, reaction baking is suited to formation of the metal carbide porous body or coating layer employed in the present invention.

The present invention is not particularly limited as long as it is a method of growing single crystal inside a crystal-growth vessel, so the present invention is widely applicable to vapor-phase methods and liquid-phase methods. Examples of a vapor-phase method to which the present invention is applied include sublimation, hydride vapor phase epitaxy (HVPE), molecular beam epitaxy (MBE), metalorganic chemical vapor deposition (MOCVD) and other various vapor-phase techniques. Owing to the metal carbide property of being a compound stable at high temperatures, the present invention is preferably applied to sublimation in which growth of III nitride single crystal such as AlN single crystal is carried out at high temperatures. Furthermore, examples of a liquid-phase method to which the present invention is applied include flux growth, melting and other various liquid-phase techniques.

Herein, how the III nitride single crystal growth method involving the present invention is applied to sublimation will be specifically explained with the Figure. A sublimation furnace serving as a crystal-growth system 10 includes: a reaction chamber 12; a crystal-growth vessel 11 disposed inside the reaction chamber 12; and heaters 13 disposed outside the reaction chamber 12, for heating the crystal-growth vessel 11. It should be understood that a porous body formed from a metal carbide, with the porosity being between 0.1% and 70% inclusive is employed in at least a portion of the crystal-growth vessel 11. Furthermore, the heaters 13 include: a first heater 13a for heating the side of the crystal-growth vessel 11 around a seed crystal 1; and a second heater for heating the side of the crystal-growth vessel 11 around a precursor 2 (a source gas for growing III nitride single crystal, ditto hereinafter).

First, a III nitride seed crystal, for example, is arranged as the seed crystal 1 in one part (top part, in the Figure) of the crystal-growth vessel 11, and III nitride powder or a III nitride poly crystal, for example, is arranged as the precursor 2 in the other part (under part, in the Figure) of the crystal-growth vessel 11.

Subsequently, a nitrogen gas, for example, is passed as an exhaust gas 5 into the reaction chamber 12, and meanwhile temperature inside the crystal-growth vessel 11 is ramped up with the first heater 13a and second heater 13b. The amount of heat from the first and second heaters 13a and 13b is adjusted, and temperature of the side of the crystal-growth vessel 11 around the precursor 2 is kept higher than temperature of the side around the seed crystal 1, to sublimate III nitride from the precursor 2 so as to serve as a source gas 4. The source gas 4 is re-solidified on the seed crystal 1 to grow a III nitride single crystal 3. It should be understood that as an exhaust gas, a nitrogen, argon or other inert gas is preferably utilized.

In the III nitride crystal growing stage, the fact that at least a part of a crystal-growth vessel is the porous body formed from a metal carbide, with the porosity being between 0.1% and 70% inclusive reduces mixtures of impurities into III nitride single crystal, and the pores in the porous body control source gases and impurity gases inside the crystal-growth vessel so as to be constant, enabling stable growth of the III nitride single crystal.

Herein, as a result of making temperature of the side of the crystal-growth vessel around the seed crystal 1 higher than temperature of the side around the precursor 2, while temperature inside the crystal-growth vessel 11 is being ramped up, the surface of the seed crystal 1 is cleaned by etching, and impurity gases inside the crystal-growth vessel 11 are discharged from the pores in the porous body to the outside of the crystal growth vessel 11 and furthermore the impurity gas discharge is prompted by the exhaust gas 5, so that the mixtures of impurities into III nitride single crystal is further reduced.

Employing the above III nitride single crystal growth method makes it possible to stably grow III nitride single crystal of favorable crystallinity, leading to a bulk, high-quality III nitride single crystal that is 2.5 cm or more in diameter, and is 200 µm or more in thickness.

Furthermore, III nitride single crystal substrates produced by processing such a bulk, high-quality III nitride single crystal find applications due to their large size and superior crystallinity in light-emitting devices such as light-emitting diodes and laser diodes, in electronic devices such as rectifiers, bipolar transistors, field-effect transistors, and high-electron-mobility transistors (HEMTs), in semiconductor sensors such as temperature sensors, pressure sensors, radiation sensors, acceleration sensors, and visible-blind ultraviolet detectors, in surface-acoustic-wave (SAW) devices, in micro-electromechanical system (MEMS) parts, in piezoelectric vibrators, in resonators, and in piezoelectric actuators.

Embodiments

Hereinafter, referring to the embodiments, the present invention will be described more specifically.

Crystal-Growth Vessel Fabrication

As a crystal-growth vessel 11 in the Figure, a porous crucible formed from TaC was fabricated in the following manner. That is, Ta powder with purity of 99.99% by mass and C powder with purity of 99.99% by mass were mixed so that elemental (atomic) ratio Ta:C was brought to 1:1, and after molded, they were burned in a carbon crucible to produce the porous crucible that was 6 cm in inner-diameter, 8 cm in interior height, and 5 mm in thickness, that was in the form of a hollow cylinder, and that was formed by TaC. Content of impurities in the porous TaC crucible measured 150 ppm by secondly ion mass spectrometry (SIMS). Furthermore, in the porous TaC crucible, porosity and diametric-span of a pore measured respectively 15% and 1 µm to 20 µm by a mercury porosimeter.

Embodiment 1

Referring to the Figure, employing the above porous TaC crucible as the crystal-growth vessel 11, an AlN single crystal (III nitride single crystal 3) was grown by sublimation. First, as the seed crystal 1, an AlN seed crystal was arranged in the top part of the porous TaC crucible (crystal-growth vessel 11), and as the precursor 2, AlN powder was arranged in the under part of the porous TaC crucible. Next, a nitrogen gas was passed as an exhaust gas into the reaction chamber 12, and meanwhile temperature of the inside of the porous TaC crucible (crystal-growth vessel 11) was ramped up with the first heater 13a and second heater 13b to bring temperature of the AlN seed crystal in the porous TaC crucible to 2200° C., and to bring temperature of the AlN powder to 2300° C. The AlN seed crystal and AlN powder temperatures were maintained for 24 hours to grow the AlN single crystal (III nitride single crystal 3) onto the AlN seed crystal (seed crystal 1). After the crystal growth, the AlN single crystal was naturally cooled, and then was taken out.

The AlN single crystal formed in the above manner was 5.08 cm in diameter, and was 3.5 mm in thickness. Furthermore, content of impurities in the AlN single crystal measured an extremely small 10 ppm by SIMS. And, the full-width at half maximum of peak in an X-ray diffraction along the AlN single crystal's (0002) was 82 arcsec, which meant that the AlN single crystal had favorable crystallinity. Moreover, in the AlN crystal growth, damages to, and defects in, the porous TaC crucible were not found. Additionally, as a result of employing the same porous TaC crucible to carry out the AlN crystal growth nine times under the same conditions, AlN single crystals formed in the nine crystal growths each had the form, size, and crystallinity equal to the AlN single crystal formed in the first crystal growth.

Embodiment 2

Employing the above porous TaC crucible as a crystal-growth vessel, a GaN single crystal was grown by Na-flux growth. First, a GaN seed crystal formed as a seed crystal by MOCVD, metal Ga as a Ga precursor, and metal Na as flux precursor (molar ratio: Ga:Na=64:36) were arranged inside the porous TaC crucible. Next, a vacuum (0.3 Pa) was drawn on the inside of the crystal-growth vessel and temperature of the inside was ramped up to 300° C., and the temperature of 300° C. was maintained for 0.5 hours to remove moisture from the GaN seed crystal, molten Ga—Na, and porous TaC crucible. Subsequently, a $N_2$ gas serving as an N precursor was introduced into the crystal-growth vessel, and the temperature of the inside of the crystal-growth vessel was ramped up to 800° C. at inner pressure of 5 MPa to maintain the temperature of 800° C. for 100 hours, to grow the GaN single crystal onto the GaN seed crystal. Herein, the above porous TaC crucible employed as the crystal-growth vessel was 15% in porosity, and was 1 µm to 20 µm (100 µm or less) in diameter of a pore, and in the above GaN single crystal growth, the molten Ga—Na leakage was not found.

The GaN single crystal formed in the above manner was 2.5 cm in diameter, and was 510 µm in thickness. Furthermore, as a result of subjecting the GaN single crystal to SIMS, Al was contained by 380 ppm as principal impurities in the GaN single crystal. And, the full-width at half maximum of peak in an X-ray diffraction along the GaN single crystal's (0002) was 60 arcsec, which meant that the GaN single crystal had favorable crystallinity.

Herein, as a result of observing the inside of the porous TaC crucible, a small number of particles were found on an interface between the crucible and the molten Ga—Na. Being collected, the particles weighed 0.6 g. Furthermore, results of analyzing the particles by X-ray diffraction demonstrated that they were GaN poly crystals.

COMPARATIVE EXAMPLE

A GaN single crystal was grown by Na-flux growth in the same manner as in Embodiment 2, apart from utilizing an $Al_2O_3$ crucible as a crystal-growth vessel. The formed GaN single crystal was 1.8 cm in diameter, and was 350 µm in thickness. Furthermore, as a result of subjecting the GaN single crystal to SIMS, Al was contained by 630 ppm as principal impurities in the GaN single crystal. Moreover, the full-width at half maximum of peak in an X-ray diffraction along the GaN single crystal's (0002) was 180 arcsec.

Herein, as a result of observing the inside of the $Al_2O_3$ crucible, a large number of particles were found on an interface between the crucible and the molten Ga—Na. Being collected, the particles weighed 1.5 g. Furthermore, results of analyzing the particles by X-ray diffraction demonstrated that they were GaN poly crystals.

From a comparison between Comparative Example and Embodiment 2, it is apparent that employing as the crystal-growth vessel the porous TaC crucible in place of the $Al_2O_3$ crucible in Na-flux growth reduced content of Al impurities in GaN single crystal from 630 ppm to 380 ppm, and decreased the full-width at half maximum of peak in an X-ray diffraction along (0002) from 180 arcsec to 60 arcsec, leading to enhancement of crystallinity. This is presumably because in $Al_2O_3$ crucibles, during single-crystal growth, Al elutes to mix into the grown single crystal, but in porous TaC crucibles, due to their high stabilities at high temperatures, highly-pure single crystals having favorable crystallinity can be formed.

From the comparison between Comparative Example and Embodiment 2, it is also evident that employing the porous TaC crucible as the crystal-growth vessel in place of the $Al_2O_3$ crucible in Na-flux growth reduced formation of poly crystalline particles from 1.5 g to 0.6 g. This is presumably because porous TaC crucibles makes likelihood of leakage in the crucible surface and molten Ga—Na lower, compared with $Al_2O_3$ crucibles The presently disclosed embodiments and implementation examples should in all respects be considered to be illustrative and not limiting. The scope of the present invention is set forth not by the foregoing description but by the scope of the patent claims, and is intended to include meanings equivalent to the scope of the patent claims and all modifications within the scope.

The invention claimed is:

1. A method of fabricating a Group III nitride single crystal growth vessel, the method comprising:
    forming from a metal carbide a porous body having a porosity of between 15% to 70% inclusive;
    covering at least a portion of the surface of the porous body with a coating layer, formed from a metal carbide, whose porosity is less than 0.1%; and
    utilizing said porous body at least partially covered with the coating layer to form at least a portion of the crystal-growth vessel.

* * * * *